United States Patent [19]

Murakami et al.

[11] Patent Number: 5,689,463

[45] Date of Patent: Nov. 18, 1997

[54] SEMICONDUCTOR MEMORY DEVICE

[75] Inventors: Hiroaki Murakami, Oita; Yoshiyuki Tanaka, Yokohama, both of Japan

[73] Assignee: Kabushiki Kaisha Toshiba, Tokyo, Japan

[21] Appl. No.: 539,237

[22] Filed: Oct. 4, 1995

[30] Foreign Application Priority Data

Oct. 4, 1994  [JP]  Japan .................................. 6-240289

[51] Int. Cl.⁶ .................................................. G11C 7/00
[52] U.S. Cl. .................. 365/200; 365/225.7; 365/230.06
[58] Field of Search ................................... 365/200, 201, 365/225.7, 230.06; 371/10.2

[56] References Cited

U.S. PATENT DOCUMENTS

| | | | |
|---|---|---|---|
| 5,083,294 | 1/1992 | Okajima | 365/200 |
| 5,295,102 | 3/1994 | McClure | 365/200 |
| 5,307,316 | 4/1994 | Takemae | 365/200 |
| 5,349,557 | 9/1994 | Yoshida | 365/200 |

FOREIGN PATENT DOCUMENTS

| | | |
|---|---|---|
| 503100 | 9/1992 | European Pat. Off. . |
| 600151 | 6/1994 | European Pat. Off. . |
| 9407211 | 3/1994 | WIPO . |

OTHER PUBLICATIONS

European Search Report, Appl. No. 95115639.7 dated Feb. 29, 1996.

*Primary Examiner*—Joseph A. Popek
*Attorney, Agent, or Firm*—Loeb & Loeb LLP

[57] ABSTRACT

A NAND type EEPROM includes block selecting circuits (BSC1 to BSC6) configured to keep a defective block non-selected in the mode for simultaneous writing and simultaneous erasure of all blocks (BLK1-BLK4) to test the device, after the defective block is replaced by a redundant block (SBLK1, SBLK2). This prohibitor a high voltage boosted by a booster circuit for simultaneous writing and simultaneous erasure of all blocks from being applied to the defective block. The block selecting circuits output a "NON-SELECT" signal when a signal instructing simultaneous writing or simultaneous erasure of all blocks is supplied after corresponding fuses (fa–fh)are blown or cut off. Therefore, once a defective block is replaced by a redundant block, there never occurs a voltage drop which may otherwise be caused by leakage of current from the defective block, and the device can be used as a non-defective NAND type EEPROM in all modes including the test mode.

8 Claims, 3 Drawing Sheets

SEMICONDUCTOR MEMORY DEVICE

BACKGROUND OF THE INVENTION

1. Field of the Invention

This invention relates to a semiconductor memory device and particularly to memory cells of NAND type EEPROMs (Electrically Erasable Programmable Read Only Memory) which are suitable for life tests performed in a test mode.

2. Description of the Background Art

FIG. 1 is a typical cross-sectional view of a memory cell of an EEPROM.

Formed on a surface of a silicon substrate 7 are a source 1 and a drain 2 at both sides of a channel 5. Made on the source 1, drain 2 and channel 5 is a floating gate 4 via an oxide film 6. A portion of the oxide film 6 lying on the drain 2 is made thinner than other portions so that it behaves as a tunneling oxide film 6a. Further formed on the floating gate 4 is a control gate 3 via another oxide film, and the entirety is covered by a further oxide film.

Storage of data in the memory cell of the EEPROM is performed by storing binary numbers 0 and 1, depending on the presence or absence of electrons on in the floating gate 4. That is, if the potential of the channel 5 between the drain 2 and the source 1 is set to 0V by applying a high voltage to the control gate 3, then a high electric field is produced in the oxide layer 6 between the floating gate 4 and the channel 5, which causes a tunneling current to flow through the tunneling oxide film 6a and causes electrons to be trapped on the floating gate 4. Then the threshold voltage of the memory cell increases (writing). To the contrary, if the potential of the control gate 3 is set to 0V, electrons are pulled out from the floating gate 4 into the channel 5. Thus the threshold voltage of the memory cell decreases (erasure).

The control of the threshold voltage of the memory cell during writing and erasure relies on the tunneling current in the oxide film in the presence of a high electric field. Since the tunneling current is very small, it can be supplied to a plurality of memory cells simultaneously. Therefore, a NAND type EEPROM can be designed to stand for the mode for simultaneous writing and simultaneous erasure as a test mode such that all memory blocks (hereinafter simply called blocks), each comprising a plurality of memory cells, can be accessed simultaneously for write and erase operations by supplying an external signal.

The high voltage required for writing and erasure is generated by a booster circuit built in the device. Although the voltage is about 24 V in most cases, there are trial devices using higher voltage values.

Like other memory devices, NAND type EEPROMs have redundant blocks and switching circuits for replacement of a defective block, if any, by one of the redundant blocks. If a defective block is found by a test in the wafer phase, the defective block is replaced by a redundant block and is held in a non-selected state by blowing (cutting off) the fuse. Then the device is used as a non-defective product.

FIG. 2 is a circuit diagram of a conventional NAND EEPROM which includes four blocks BLK1 to BLK4 having block addresses BA0, BA1, /BA0, /BA1, respectively, and two redundant blocks SBLK1 and SBLK2 prepared as spare blocks. 3-input NAND gates ND41 to ND44 are provided in combination with four blocks BLK1 to BLK4 for normal use, respectivelyt and 2-input NAND gates ND45, ND46 are provided in combination with two redundant blocks SBLK1 and SBLK2, respectively. In this text, inverse logic signals are expressed by attaching "/" to original logic signals. In the drawings, however, they are shown by attaching an upper bar according to the usual practice for expressing inverse logic signals.

Each of the NAND gates ND41 to ND44 associated with blocks BLK1 to BLK4 is supplied with two block address signals designating a respective block and a switch signal for replacing the block with a redundant block. Each of the redundant blocks SBLK1 and SBLK2 associated with the NAND gates ND45 and ND46 is supplied with two block address signals designating a respective block.

Explained below is the process of replacement of BLK2 with one of the spare blocks, SBLK1, in the circuit of FIG. 2. Block addresses of BLK 2 are BA0=H and BA1=L. Thus /BA0=L and/BA1=H. To replace BLK2 by SBLK1, fuses $f_a$ and $f_d$ among fuses $f_a$ to $f_d$ for SBLK1 1 are blown.

At this time, the externally supplied control signal /CPE (Chip Enable) is L, and the signal/CPE* obtained from /CPE through the buffer is the same logic signal as/CPE. Then /CPE* also becomes L.

RDE (Redundancy Enable) becomes H when a normally used block is replaced by a spare block.

When the device is not in the test mode, i.e., when the test signal TST is L, $V_1$=H gives $V_3$=L, and $V_2$=L gives $V_4$=H. TST=L gives $V_5=V_6$=H, resulting in $V_7$=H and $V_8$=L. Then $V_9$=H and $V_{10}$=H. Thus $V_{11}$=L. Further, since $V_9=V_{12}$=H, and also RDE is H, then $V_{13}$=L and $V_{14}$=H. Therefore, irrespective of L and H of $V_{15}$ to $V_{25}$, $V_{31}$ to $V_{34}$ become L, and $V_{27}=V_{28}$=H gives $V_{35}$=H, and $V_{29}$=L and $V_{30}$=H give $V_{36}$=L. Thus SBLK 1 is selected.

As described above, by switching from a defective block to a redundant block by blowing fuses such that the defective block cannot be selected, the device can be used as a non-defective product.

However, such a NAND type EEPROM configured to use a redundant block in place of a defective block involve the problem that, due to its circuit arrangement, a high voltage is also applied to the defective block which has been replaced by a redundant block by blowing fuses in the mode for simultaneous writing and simultaneous erasure as a test mode.

In the test mode, that is, under TST=H, $V_5=V_6$=L. Then $V_7$=H and $V_8$=H, regardless of L and H of $V_3$ and $V_4$. Further, since $V_{10}$=L, $V_{11}$=H, and $V_{12}$=H gives RDE=H, resulting in $V_{13}=V_{14}$=H. Therefore, $V_{15}$ to $V_{30}$ become H, and all blocks are selected.

Therefore, when a high voltage for simultaneous write and erase operations of all blocks is applied, a large current may leak from defective blocks, which will cause a drop of the voltage once boosted by the booster circuit for simultaneous writing and erasure. Even if the leak current is initially small, it may occasionally increase as the defects progress during a subsequent test using the test mode. In this case, although all defective blocks have been replaced by redundant blocks and all remaining blocks are non-defective, the device becomes unable to perform write and erase operations because it cannot obtain a sufficient voltage- That ist even though the device exhibits a completely non-defective product when used in all modes except for the test mode, once it is put in the test mode for performing a life test by applying a high voltage for simultaneous writing and erasure, the device falls into the status where, due to the presence of the defective blocks, the regular voltage is not applied to the other non-defective blocks, and the test cannot be executed.

SUMMARY OF THE INVENTION

It is therefore an object of the invention to provide a NAND type EEPROM having a circuit arrangement in which a high voltage for simultaneous writing and erasure is not applied to defective blocks already replaced by redundant blocks when the device is in the test mode.

The device includes block selecting circuits which prohibit application of the voltage for simultaneous writing and erasure to defective blocks when the device is in the mode for access to all blocks for simultaneous writing and erasure. After the defective blocks are replaced with redundant blocks, the high voltape generated by the booster circuit for simultaneous writing and erasure of all blocks is prevented from dropping due to leakage of the current from the defective blocks. Therefore, the device can be used as a non-defective NAND type EEPROM in all modes including the test mode, provided the defective blocks are replaced by redundant blocks.

Since each block selecting circuit is configured to output a "NON-SELECT" signal when it receives the signal instructing simultaneous writing and simultaneous erasure after the fuse is blown, the voltage for simultaneous write and erase is never applied to the defective block replaced by a redundant block.

DESCRIPTION OF THE PREFERRED EMBODIMENTS

Figure 2:
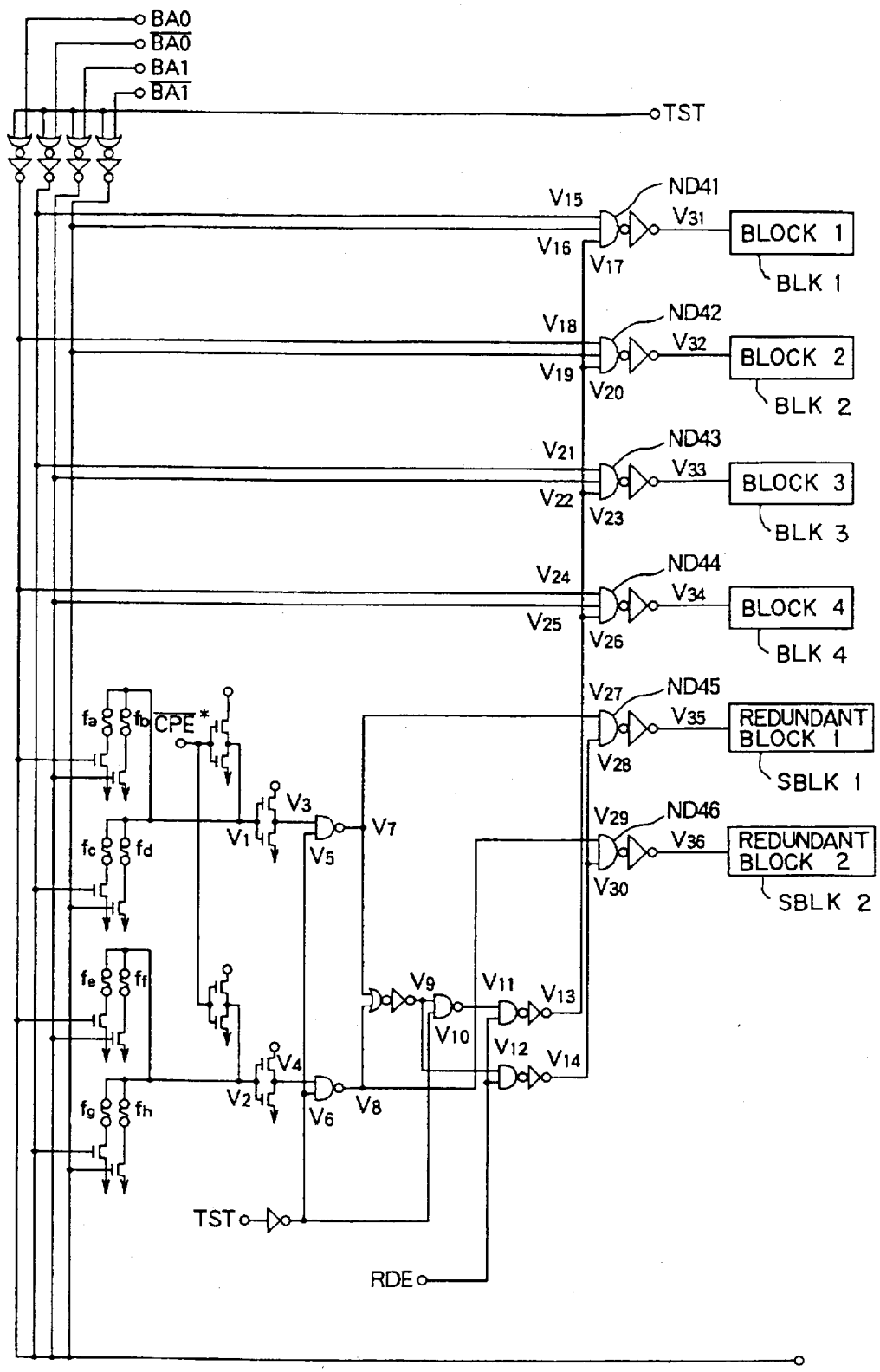
FIG. 2 is a circuit diagram of a conventional NAND type EEPROM.
Figure 3:
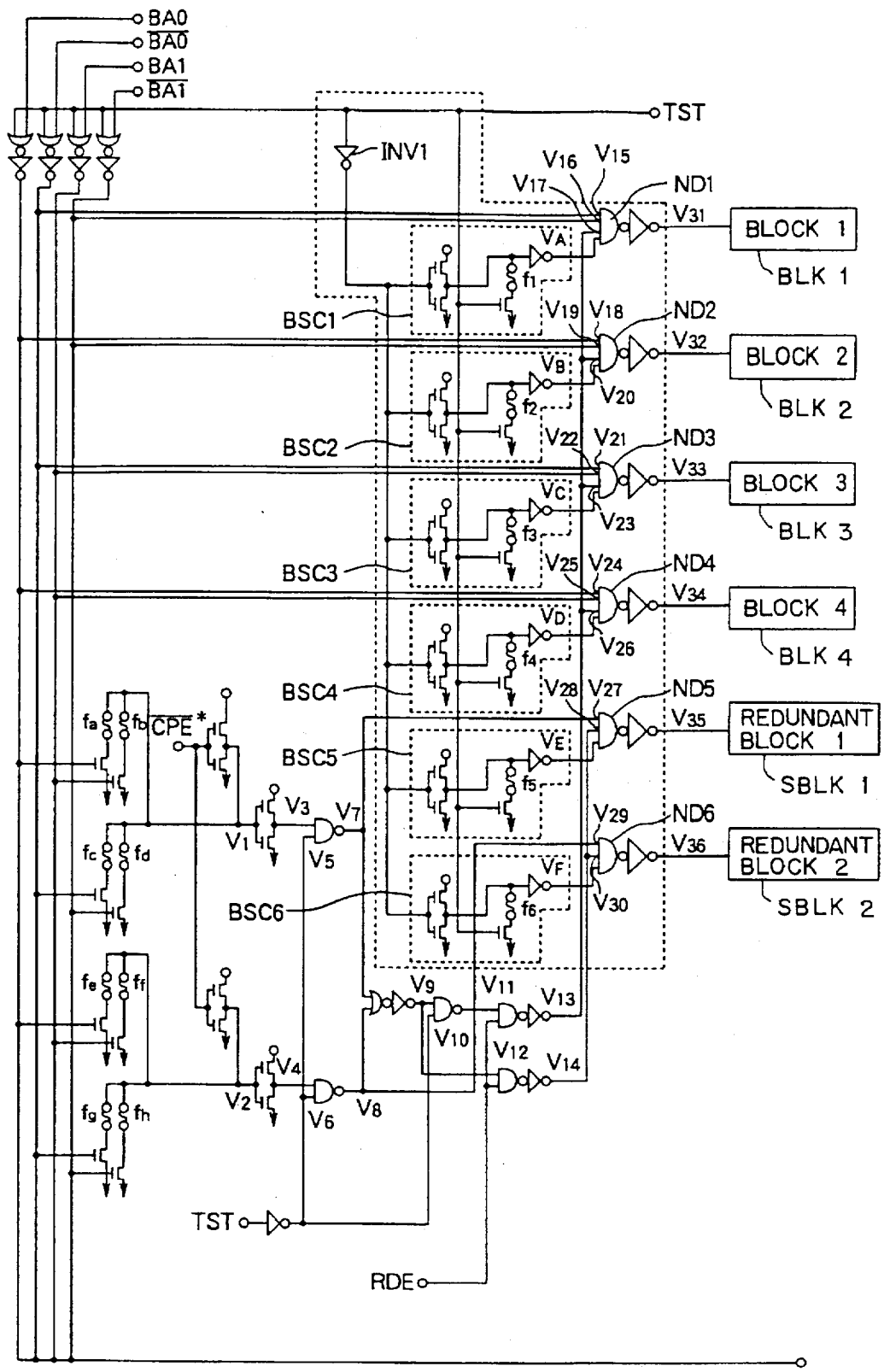
FIG. 3 is a circuit diagram of a NAND EEPROM having block selecting circuits, taken as an embodiment of the invention.

FIGS. 3 is a circuit diagram of a NAND EEPROM having block selecting circuits, taken as an embodiment of the invention. This is a circuit in which a respective block selecting circuit is provided in the box drawn with the dotted line in FIG. 3 to make a pair with each block in the circuit of FIG. 2, shown as a prior art, which includes four blocks BLK1-BLK4 having block addresses BA0, BA1, /BA0,/BA1, and two spare redundant blocks SBLK1 and SBLK2. Each block selecting circuit is made of an inverter INV1 and corresponding one of circuits BSC1 to BSC6. 4-input NAND gates ND1 to ND4 are provided for normally used blocks BLK1 to BLK4, respectively, and 5-input NAND gates ND5 to ND6 are provided for redundant blocks SBLK1 and SBLK2.

Similarly to the prior art of FIG. 2, the NAND gates ND1 to ND4 associated with BLK1 to BLK4 are supplied with two block address signals designating individual blocks and a switch signal for switching from the block to a redundant block. The NAND gates ND5 and ND6 for the redundant blocks SBLK1 and SBLK2 are supplied with two block address signals designating the respective blocks. Additionally, the NAND gates ND1 to ND6 for BLK1 to BLK4, and for SBLK1 and SBLK2 are supplied with output signals from respective block selecting circuits. The block selecting circuits are explained below in greater detail.

Figure 1:
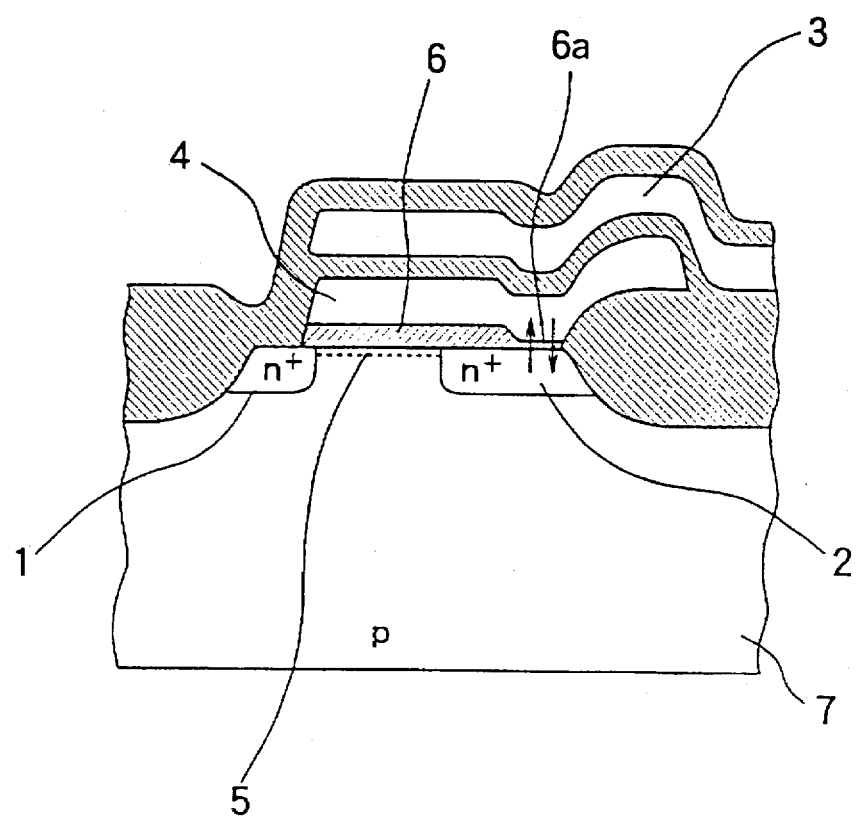
FIG. 1 is a cross-sectional view of a memory cell of an EEPROM.
Figure 4:
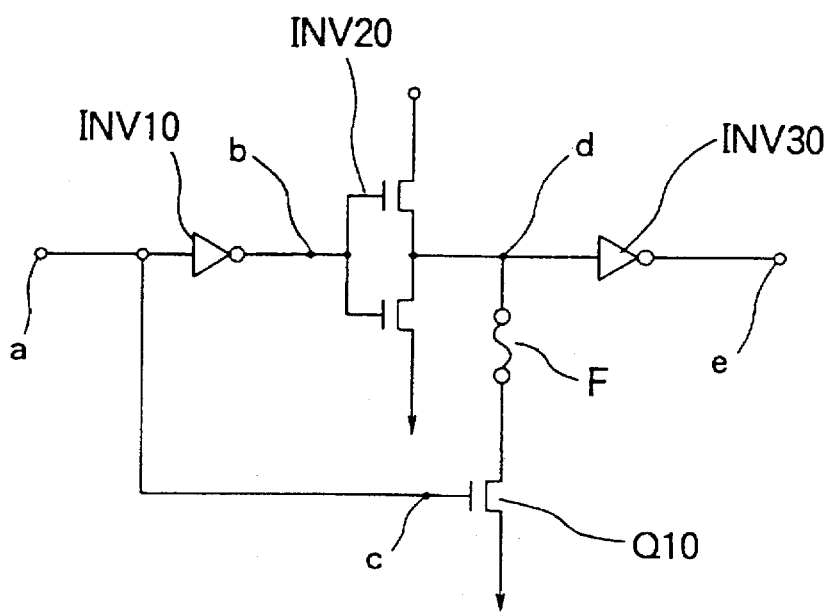
FIG. 4 is a circuit diagram of an elemental unit of the block selecting circuits used in the invention.

FIG. 4 is a circuit diagram of an elemental unit of the block selecting circuits according to an embodiment of the invention. FIG. 4 which shows one of the BSC circuits coupled to the inverter INV1 in the circuit of FIG. 3The The input terminal a is coupled to the common gate input terminal b of a CMOS inverter INV20 via an inverter INV10 on one hand and directly to a gate terminal c of a MOSFET Q10 on the other hand. One of the source and drain of the MOSFET Q10 is grounded, and the other of them is coupled to the output point d via a fuse F and further to the output terminal e through an inverter INV30.

The block selecting circuit operates as follows, where signal voltages at points a, b, c, d and e are labelled $V_a$, $V_b$, $V_c$, $V_d$ and $V_e$.

(1) When the fuse F is connected:

When the device is not in the test mode, $V_a$=L is input. Then $V_b$=H, $V_c$=L and $V_d$=L. Therefore $V_e$=H, that is, a "SELECT" signal is output.

In the test mode, $V_a$=H is input. Then $V_b$=L, $V_c$=H and $V_d$=L. Thus $V_e$=H, that is, the "SELECT" signal is output.

(2) When the fuse F is blown:

When the device is not in the test mode, $V_a$=L is input. Then $V_b$=H and $V_d$=L. Thus $V_e$=H, that is, the "SELECT" signal is output.

In the test mode, $V_a$=H is input. Then $V_b$=L and $V_d$=H. Thus $V_e$=L, that is, the "NON-SELECT" signal is output.

As mentioned above, only when the fuse F in each block selecting circuit is blown and the test mode signal is input, is the "NON-SELECT" signal output.

In lieu of the fuse used as means for cutting the path between the point d and MOSFET Q10, any appropriate element such as a PROM may be used. Usable in lieu of the MOSFET is any appropriate element capable of supplying "SELECT" signal "H" by changing the signal "H" at point d into "L" when signal "H" is input while the path to point d is held connected.

As shown in FIG. 3, a respective block selecting circuit comprising the inverter INV1 and a respective one of the circuits BSC1 to BSC6 is provided for a respective block. The inverter INV1 and the gates of the MOSFETs in the circuits BSC1 to BSC6 are supplied with a test mode switch signal, and their output terminals are connected to the NAND gates ND1 to ND6 combined with the respective blocks.

Explained below is the process of replacement of BLK2 with one of the spare blocks, SBLK1, in the circuit of FIG. 3. Block addresses of BLK2 are BA0=H and BA1=L. Thus /BA0=L and /BA1=H. To replace BLK2 by SBLK1, fuses $f_a$ and $f_d$ among fuses $f_a$ to $f_d$ for SBLK1 are blown.

At this time, the externally supplied control signal /CPE is "L", and the signal /CPE* obtained from /CPE through the buffer is the same logic signal as /CPE. Then /CPE* also becomes "L".

RDE becomes "H" when a normally used block is replaced by a spare block.

When the device is not in the test mode, i.e., when the test signal TST is L, $V_1$=H gives $V_3$=L, and $V_2$=L gives $V_4$=H. TST=L gives $V_5$=$V_6$=H, resulting in $V_7$=H and $V_8$=L. Then $V_9$=H and $V_{10}$=H. Thus $V_{11}$=L. Further, since $V_9$=$V_{12}$=H, and also RDE is "H", then $V_{13}$=L and $V_{14}$=H. Therefore, irrespective of "L" and "H" of $V_{15}$ to $V_{25}$, $V_{31}$ to $V_{34}$ become "L", and $V_{27}$=$V_{28}$=H gives $V_{35}$=H, and $V_{29}$=L and $V_{30}$=H give $V_{36}$=L. Thus SBLK1 is selected.

As explained above, by switching from a defective block to a redundant block by blowing fuses such that the defective block cannot be selected, the device can be used as a non-defective product.

At the same time, the fuse $f_2$ of the block selecting circuit for BLK2 is blown.

In the test mode, that is, under TST=H, $V_5$=$V_6$=L. Then $V_7$=H and $V_8$=H, regardless of "L" and "H" of $V_3$ and $V_4$.

Further, since $V_{10}$=L, $V_{11}$=H, and $V_{12}$=H gives RDE=H, resulting in $V_{13}$=$V_{14}$=H. Therefore, $V_{15}$ to $V_{30}$ become "H". However, the block selecting circuit for BLK2, in which the fuse $f_2$ has been cut off, supplies a non-select signal "L" when the signal TST=H is input in the test mode. That is, since $V_B$ becomes "L" and it is input to the NAND gate for BLK2, only BLK2 is held non-selected, and the voltage for simultaneous writing and simultaneous erasure is not applied to BLK2.

As reviewed above, once the fuse of the block selecting circuit associated with a defective block is cut off, it is effectively prohibited that a high voltage for simultaneous writing and simultaneous erasure of all blocks is given to defective blocks.

As described above, according to the invention, the device includes block selecting circuits which never selects a defective block once replaced by a redundant block in the mode for simultaneous writing and simultaneous erasure of all blocks. Therefore, once a defective block is replaced by a redundant block, it never occurs that the voltage boosted by the booster circuit for simultaneous writing and simultaneous erasure of all blocks drops due to leakage of current from the defective block. Thus the device can successfully undergo a life test which requires application of a high voltage for simultaneous writing and simultaneous erasure of all blocks, and can be used as a non-defective NAND type EEPROM in all other modes as well.

Since each of the block selecting circuits is configured to output the "NON-SELECT" signal when it receives a signal instructing simultaneous writing or simultaneous erasure after the fuse is blown, the voltage for simultaneous writing and simultaneous erasure is never applied to the defective block already replaced by a redundant block.

What is claimed is:

1. A semiconductor memory device comprising:

a plurality of memory blocks, each of the memory blocks including a plurality of memory cells;

at least one redundant block to be used in place of a selected memory block of said memory blocks;

switch means for replacing said selected memory block with said redundant block; and prohibiting means for prohibiting said selected meafoty block, which has been replaced by said redundant block, from being selected in response to a selection inpm signal which simultaneously selects all blocks, wherein said prohibiting means includes a plurality of block selecting circuits, one of the block selecting circuits being provided for each of the memory blocks, said block selecting circuit including:

a first signal path having a plurality of logic gates;

signal inverter means for inverting a signal passing through said logic gates in response to the selection input signal; and signal path blocking means for blocking a second signal path between said first signal path and said signal inverter means in response to the replacement by said switch means.

2. The semiconductor memory device as defined in claim 1, wherein said signal path blocking means includes fuse.

3. The semiconductor memory device as defined in claim 1, wherein said signal path blocking means includes PROM.

4. The semiconductor memory device as defined in claim 1, wherein said plurality of logic gates includes serially-connected inverters, and said signal inverter means includes a MOSFET.

5. A semiconductor memory device comprising:

a plurality of memory blocks including a first memory block, each of the memory blocks including a plurality of memory cells;

a plurality of redundant blocks including first and second redundant blocks, each of the redundant blocks being selectively used to replace one of the memory blocks;

switch means for replacing the first memory block with the first redundant block; and prohibiting means for prohibiting the first memory block, which has been replaced by the first redundant block, from being selected in response to a selection input signal which simultaneously selects all of the memory blocks, wherein the prohibiting means also prohibits the second redundant block, which is not being used to replace one of the memory blocks, from being selected in response to the selection input signal, and the prohibiting means includes a plurality of first block selecting circuits; one of the first block selecting circuits being provided for each of the memory blocks, the first block selecting circuit including:

a first signal path having a first plurality of logic gates;

first signal inverter means for inverting a signal passing through the first logic gates in response to the selection input signal; and first signal path blocking means for blocking a second signal path between the first signal path and the first signal inverter means when the corresponding memory block has been replaced by one of the redundant blocks.

6. The semiconductor memory device as defined in claim 5, wherein the prohibiting means further includes a plurality of second block selecting circuits, one of the second block selecting circuits being provided for each of the redundant blocks, the second block selecting circuit including:

a third signal path having a second plurality of logic gates;

second signal inverter means for inverting a signal passing through the second logic gates in response to the selection input signal; and second signal path blocking means for blocking a fourth signal path between the third signal path and the second signal inverter means when the corresponding redundant block is not being used to replace one of the memory blocks.

7. The semiconductor memory device as defined in claim 6, wherein the first and second signal path blocking means include a fuse.

8. The semiconductor memory device as defined in claim 6, wherein the first and second signal path blocking means include a PROM.

* * * * *

UNITED STATES PATENT AND TRADEMARK OFFICE
CERTIFICATE OF CORRECTION

PATENT NO.   : 5,689,463
DATED        : November 18, 1997
INVENTOR(S)  : HIROAKI MURAKAMI, ET AL.

It is certified that error appears in the above-identified patent and that said Letters Patent is hereby corrected as shown below:

Column 5, line 43, delete "meafoty" and insert therefor --memory--
Column 5, line 46, delete "inpm" and insert therefor --input--

Signed and Sealed this

Thirtieth Day of November, 1999

Attest:

Q. TODD DICKINSON

Attesting Officer

Acting Commissioner of Patents and Trademarks